(12) United States Patent
Horng et al.

(10) Patent No.: US 8,279,607 B2
(45) Date of Patent: Oct. 2, 2012

(54) COOLING MODULE ASSEMBLY METHOD

(75) Inventors: Alex Horng, Kaohsiung (TW);
Chi-Hung Kuo, Kaohsiung (TW);
Chih-Hao Chung, Kaohsiung (TW);
Chung-Ken Cheng, Kaohsiung (TW);
Jui-Feng Wang, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 99 days.

(21) Appl. No.: 12/826,779

(22) Filed: Jun. 30, 2010

(65) Prior Publication Data

US 2011/0292614 A1    Dec. 1, 2011

(30) Foreign Application Priority Data

May 25, 2010  (TW) .............................. 99116733 A

(51) Int. Cl.
*H05K 7/20*   (2006.01)
(52) U.S. Cl. ........ 361/719; 361/710; 361/720; 165/185; 174/252; 257/720; 438/122
(58) Field of Classification Search .................. 361/688, 361/700–722
See application file for complete search history.

(56) References Cited

U.S. PATENT DOCUMENTS

| | | | |
|---|---|---|---|
| 5,083,052 A | 1/1992 | Ochi | |
| 5,708,566 A * | 1/1998 | Hunninghaus et al. | 361/704 |
| 5,812,375 A * | 9/1998 | Casperson | 361/707 |
| 5,923,084 A * | 7/1999 | Inoue et al. | 257/712 |
| 6,304,445 B1 | 10/2001 | Bollesen | |
| 6,350,952 B1 * | 2/2002 | Gaku et al. | 174/522 |
| 6,881,077 B2 * | 4/2005 | Throum | 439/76.1 |
| 6,892,449 B1 * | 5/2005 | Brophy et al. | 29/827 |
| 7,352,585 B2 * | 4/2008 | Mandel et al. | 361/714 |
| 7,623,349 B2 * | 11/2009 | Refai-Ahmed et al. | 361/719 |
| 2002/0131240 A1* | 9/2002 | Kim | 361/719 |
| 2003/0184969 A1* | 10/2003 | Itabashi et al. | 361/688 |
| 2006/0107523 A1* | 5/2006 | Blossfeld et al. | 29/830 |
| 2010/0124024 A1* | 5/2010 | Nishiuma et al. | 361/705 |

* cited by examiner

*Primary Examiner* — Courtney Smith
(74) *Attorney, Agent, or Firm* — Alan Kamrath; Kamrath IP Lawfirm, PA

(57) ABSTRACT

A cooling module assembly method includes forming at least one through-hole on a circuit board; coupling the circuit board to a heat dissipating unit so that a face of the circuit board is coupled to a coupling face of the heat dissipating unit; filling the at least one through-hole with metal solders; fixing at least one heat-generating element to another face of the circuit board, with the at least one heat-generating element aligned with and covering the at least one through-hole; and soldering the at least one heat-generating element and the heat dissipating unit together by melting the metal solders in the at least one through-hole.

20 Claims, 17 Drawing Sheets

COOLING MODULE ASSEMBLY METHOD

BACKGROUND OF THE INVENTION

1. Field of the Invention

The present invention generally relates to a cooling module assembly method and, more particularly, to a cooling module assembly method that can improve cooling efficiency of an assembled cooling module.

2. Description of the Related Art

FIGS. 1 and 2 show a conventional cooling module assembly method. The assembly method firstly couples a circuit board 91 to a first surface 921 of a heat spreader plate 92 by ways of heat pressing, adhering, screwing, etc. A base plate is formed after the circuit board 91 is coupled to the heat spreader plate 92. The heat spreader plate 92 is aluminum having excellent thermal conducting properties and a low specific gravity. The assembly method coats a coupling face 931 of a heat dissipating unit 93 with an adhesive (such as thermal grease) having excellent heat conducting properties, which forms a heat-conducting layer 94 between the heat dissipating unit 93 and the heat spreader plate 92. Hence, a second surface 922 of the heat spreader plate 92 may be adhered to the coupling face 931 of the heat dissipating unit 93. In the same time, a plurality of screw holes 95 is aligned with a plurality of screw holes 932 of the heat dissipating unit 93. The assembly method screws each pair of screw holes 932 and 95 together using a screwing member 96 so that the base plate is closely coupled with the coupling face 931 of the heat dissipating unit 93. Finally, the pins 971 of a plurality of heat-generating elements 97 are soldered on one face of the circuit board 91 to form an electrical connection between the heat-generating elements 97 and a circuit routing embedded in the circuit board 91.

During operation of the heat-generating elements 97, the heat generated by the heat-generating elements 97 will be constantly absorbed by the heat spreader plate 92 via the circuit board 91. In the same time, the absorbed heat of the heat spreader plate 92 will be delivered to the heat dissipating unit 93 via the heat-conducting layer 94. In addition, a plurality of fins 933 is evenly spaced on one side of the heat dissipating unit 93 not coupling with the heat spreader plate 92, thereby increasing the cooling areas of the heat dissipating unit 93. Thus, degraded performance or damages of the heat-generating elements 97 due to high working temperature may be prevented.

In the conventional cooling module, the heat generated by the heat-generating elements 97 is delivered to the fins 933 of the heat dissipating unit 93 via multiple layers such as the circuit board 91, heat spreader plate 92 and the heat-conducting layer 94. However, the circuit board 91, heat spreader plate 92 and the heat-conducting layer 94 are of different materials, which can lead to poor heat conductivity. For example, the circuit board 91 is mainly made of an insulating material such as an epoxy resin or bakelite having poorer heat conductivity. Thus, cooling efficiency of the cooling module is significantly affected. The multiple structures of the cooling module not only reduce the cooling efficiency but also increase the assembly cost of the cooling module.

Moreover, since the heat spreader plate 92 and the heat dissipating unit 93 are made of metal material, the heat-conducting layer 94 is required to be disposed between the heat dissipating unit 93 and the heat spreader plate 92 for enhancing the coupling strength therebetween. Thus, the assembly of the cooling module is more complicated, and assembly efficiency is lowered. In light of the problems, it is desired to improve the conventional cooling module assembly method.

SUMMARY OF THE INVENTION

It is therefore the primary objective of this invention to provide a cooling module assembly method which improves cooling efficiency of a cooling module by directing heat generated by a heat-generating element to a heat dissipating unit of the cooling module.

It is another objective of this invention to provide a cooling module assembly method which improves assembly efficiency by omitting unnecessary components.

The invention discloses a cooling module assembly method comprising: forming at least one through-hole on a circuit board; coupling the circuit board to a heat dissipating unit so that a face of the circuit board is coupled to a coupling face of the heat dissipating unit; filling the at least one through-hole with metal solders; fixing at least one heat-generating element to another face of the circuit board, with the at least one heat-generating element aligned with and covering the at least one through-hole; and soldering the at least one heat-generating element and the heat dissipating unit together by melting the metal solders in the at least one through-hole.

Furthermore, the invention discloses a cooling module assembly method comprising: forming at least one through-hole on a circuit board; fixing at least one heat-generating element to a face of the circuit board, with the at least one heat-generating element aligned with and covering one end of the at least one through-hole; filling the at least one through-hole with metal solders; coupling a heat dissipating unit to another face of the circuit board, with the heat dissipating unit including a coupling face aligning with and covering another end of the at least one through-hole; and soldering the at least one heat-generating element and the heat dissipating unit together by melting the metal solders in the at least one through-hole.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
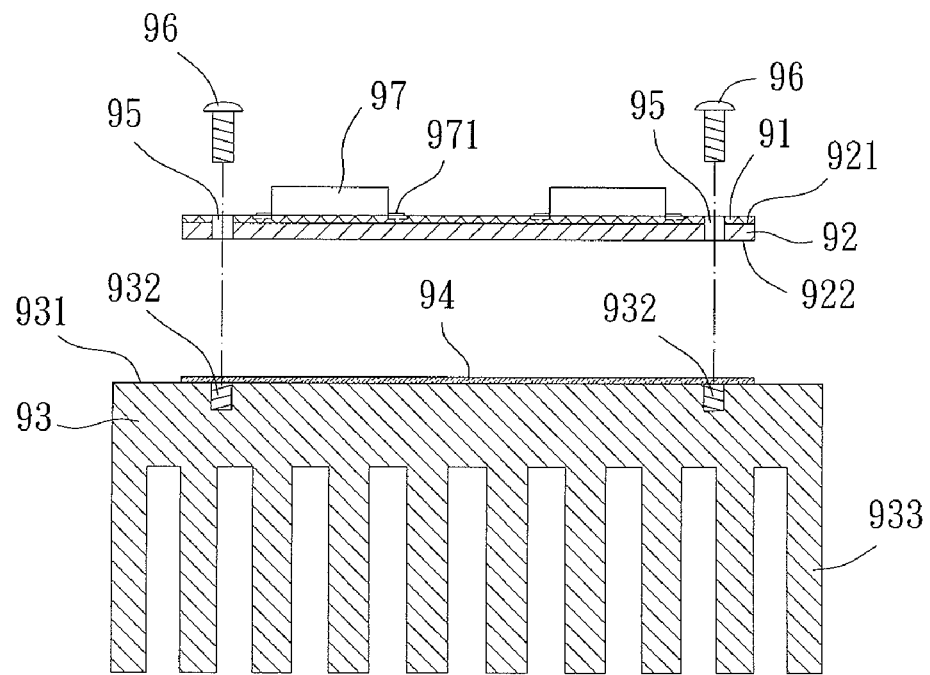
FIG. 1 shows a cooling module before being assembled by a conventional cooling module assembly method.
Figure 2:
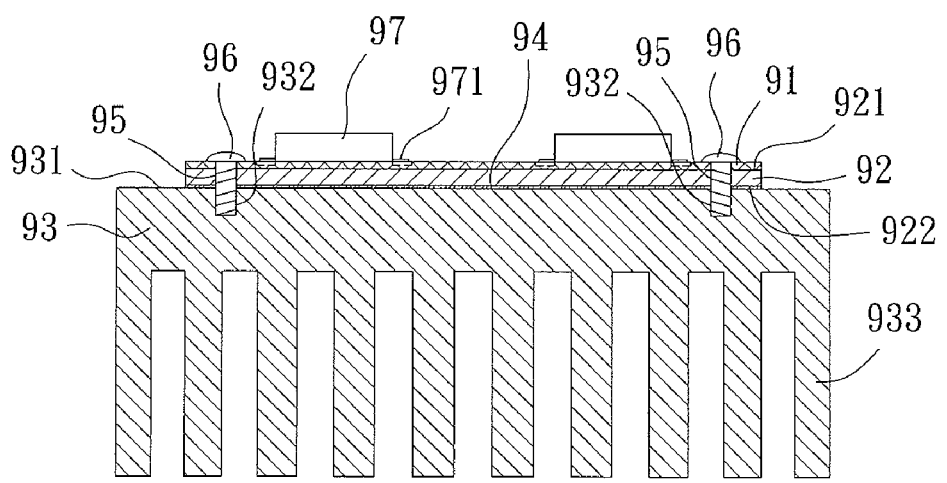
FIG. 2 shows a cooling module after being assembled by the conventional cooling module assembly method.
Figure 3:
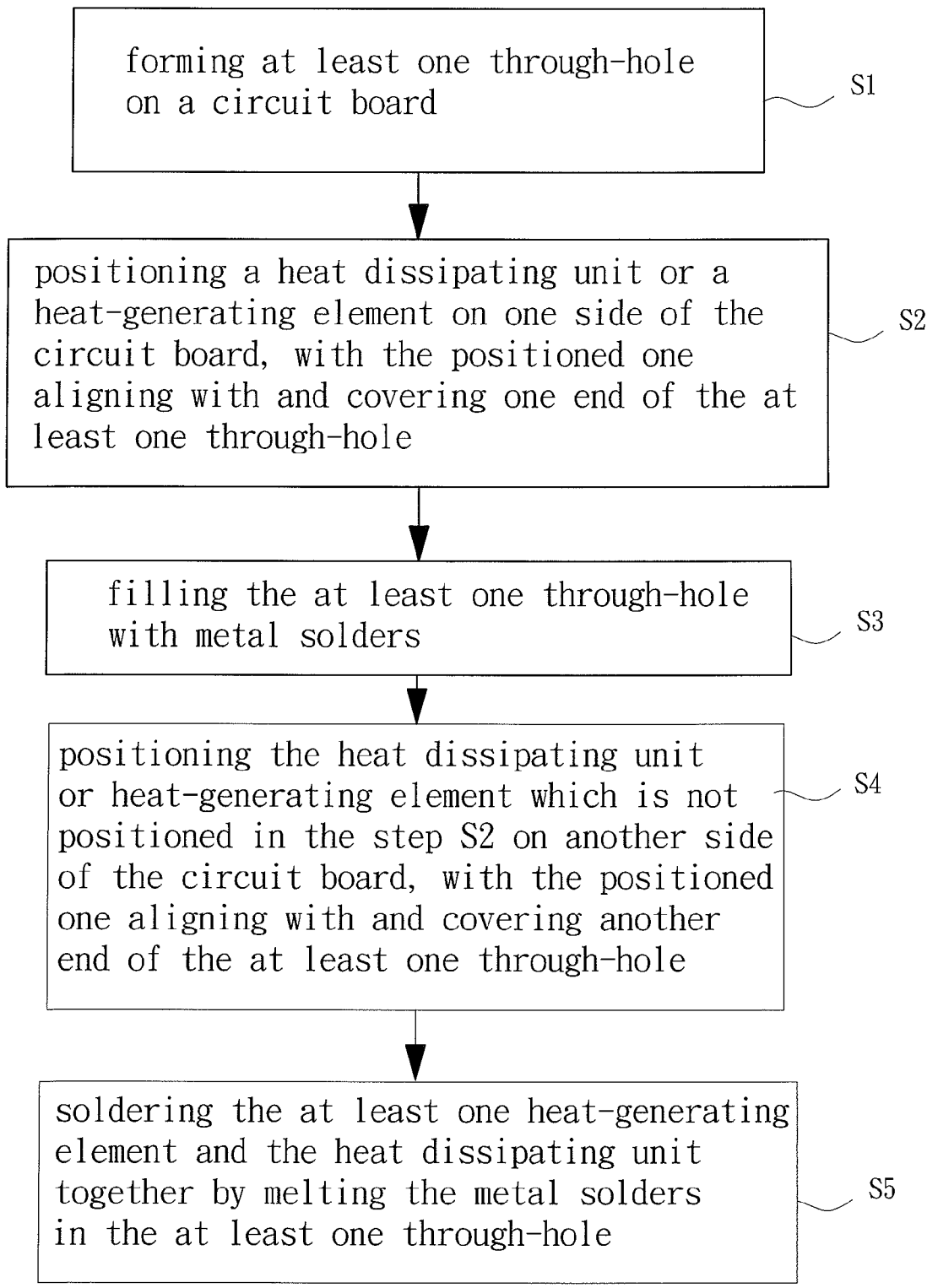
FIG. 3 shows a flowchart of a cooling module assembly method according to a first embodiment of the invention.

In the various figures of the drawings, the same numerals designate the same or similar parts. Furthermore, when the term "first", "second", "third", "fourth", "inner", "outer" "top", "bottom" and similar terms are used hereinafter, it should be understood that these terms are reference only to the structure shown in the drawings as it would appear to a person viewing the drawings and are utilized only to facilitate describing the invention.

DETAILED DESCRIPTION OF THE INVENTION

Referring to FIGS. 3 to 10, a light-emitting device (LED) lamp is used for illustration of a cooling module assembly method according to a first embodiment of the invention. However, the proposed assembly method may be applied to a variety of electronic equipments rather than merely to the LED lamp.

Referring to FIGS. 3 to 10 again, the cooling module assembly method comprises the following steps: forming at least one through-hole 11 on a circuit board 1; coupling a face of the circuit board 1 to a coupling face 21 of a heat dissipating unit 2; filling the at least one through-hole 11 with metal solders 3; fixing at least one heat-generating element 4 to another face of the circuit board 1, with the at least one heat-generating element 4 aligning with and covering the at least one through-hole 11; and soldering the heat-generating element 4 and the heat dissipating unit 2 together by melting the metal solders 3 in the at least one through-hole 11.

Figure 4:
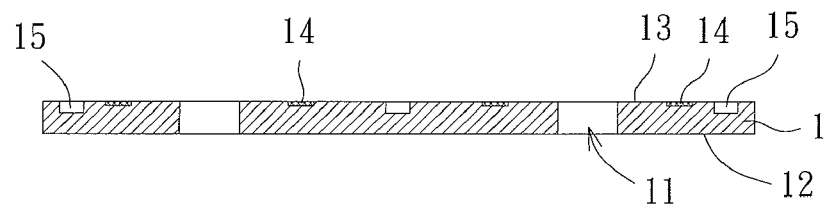
FIG. 4 shows a first step of the cooling module assembly method for assembling the cooling module according to the first embodiment of the invention.

Specifically, referring to FIG. 4, the cooling module assembly method in the first embodiment comprises a first step S1 forming the at least one through-hole 11 on the circuit board 1 by way of mechanical molding (such as punching). The circuit board 1 is a printed circuit board (PCB) preferably being a FR-4 or FR-5 plate. The circuit board 1 comprises a first face 12 and a second face 13 on two sides thereof. The at least one through-hole 11 extends through the first face 12 and second face 13 of the circuit board 1.

Figure 5:
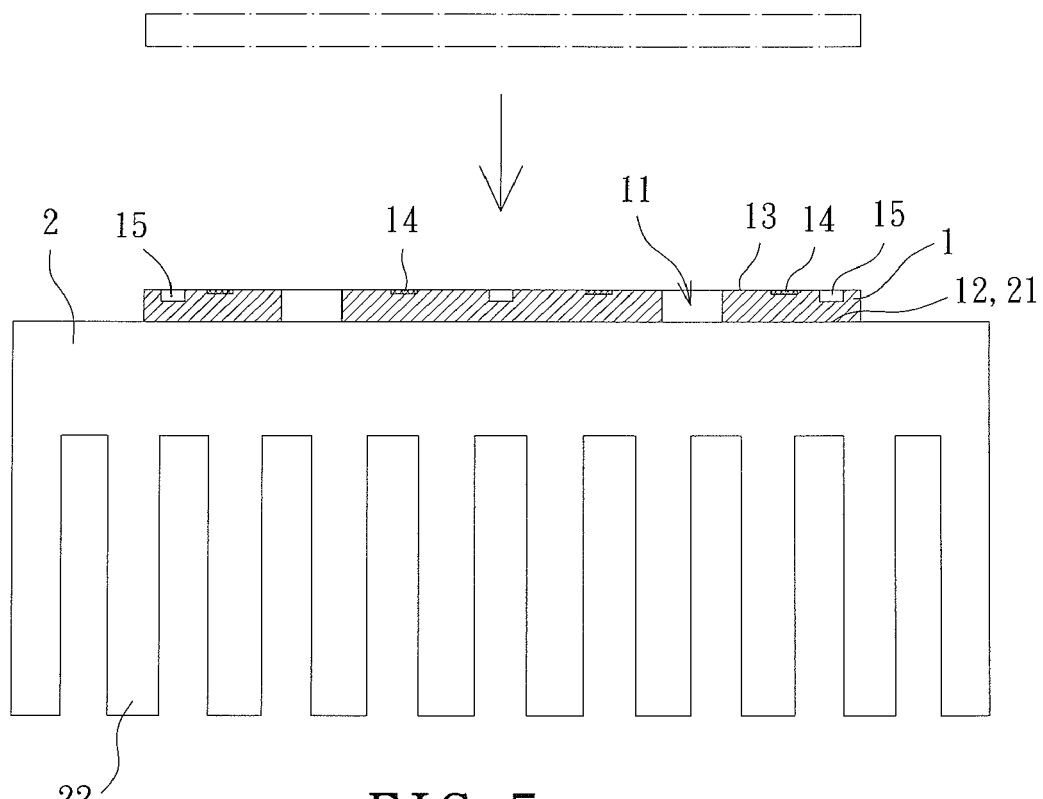
FIG. 5 shows a second step of the cooling module assembly method for assembling the cooling module according to the first embodiment of the invention.

Referring to FIG. 5, the cooling module assembly method in the first embodiment comprises a second step S2 of positioning the circuit board 1 on the heat dissipating unit 2 so that the first face 12 of the circuit board 1 is coupled to the coupling face 21 of the heat dissipating unit 2. Based on this, one end of the at least one through-hole 11 is closed by the heat dissipating unit 2. The heat dissipating unit 2 is preferably a heat sink made of a metal material with high heat conductivity, such as aluminum, copper, silver, an alloy thereof or the like. The heat dissipating unit 2 comprises a plurality of fins 22 on another face opposing to the coupling face 21. Thus, the heat dissipating unit 2 may have larger heat-exchanging areas with the air, and the cooling efficiency is therefore increased.

Figure 6:
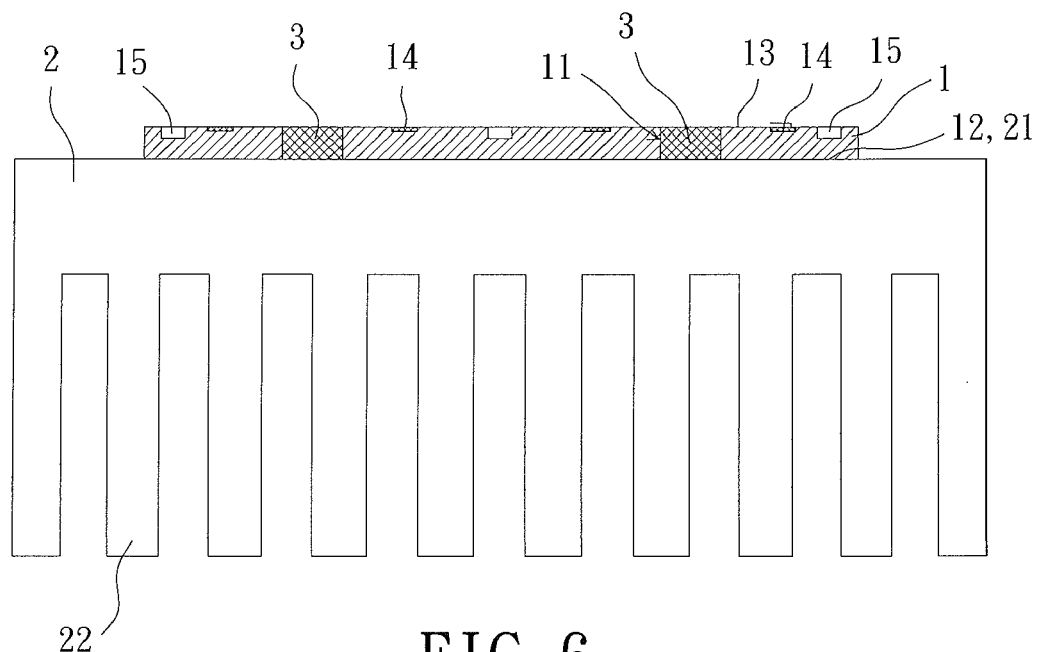
FIG. 6 shows a third step of the cooling module assembly method for assembling the cooling module according to the first embodiment of the invention.

Referring to FIG. 6, the cooling module assembly method in the first embodiment comprises a third step S3 of filling the at least one through-hole 11 with the metal solders 3 from another end of the at least one through-hole 11 not closed by the heat dissipating unit 2, and coating a plurality of contacts 14 of the circuit board 1 with the metal solders 3. The metal solders 3 are preferably made of a material with high heat conductivity, such as a solder paste.

Figure 7:
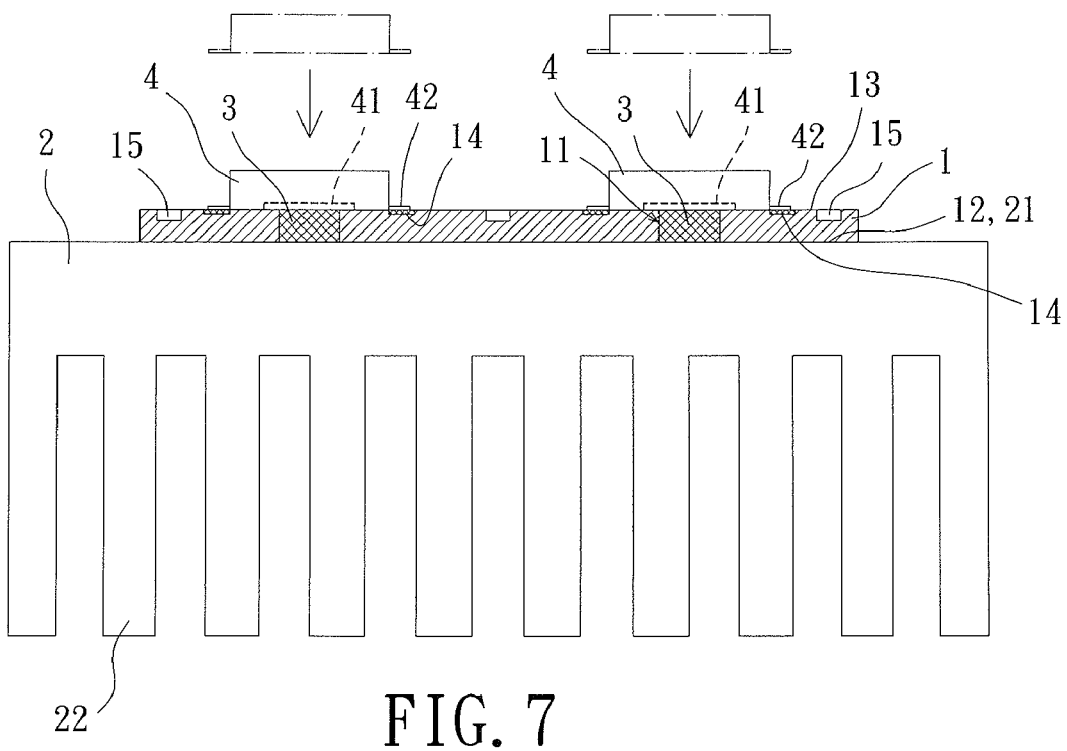
FIG. 7 shows a fourth step of the cooling module assembly method for assembling the cooling module according to the first embodiment of the invention.

Referring to FIG. 7, the cooling module assembly method in the first embodiment comprises a fourth step S4 of disposing the heat-generating element 4 on the second face 13 of the circuit board 1, with a heat-conducting portion 41 of the heat-generating element 4 aligning with and covering another end of the at least one through-hole 11 to enclose the metal solders 3 in the at least one through-hole 11. At this time, a plurality of pins 42 of the heat-generating element 4 aligns with the contacts 14 of the circuit board 1. The heat-conducting portion 41 is preferably made of a metal material with high heat conductivity, such as aluminum, copper, silver, or combination thereof In addition, the contact area of the heat-conducting portion 41 is larger than an opening area of the at least one through-hole 11 so that the at least one through-hole 11 may be totally covered by the heat-conducting portion 41. Since the LED lamp is used for illustration in the first embodiment, the heat-generating element 4 is preferably a LED but not limited thereto.

Figure 8:
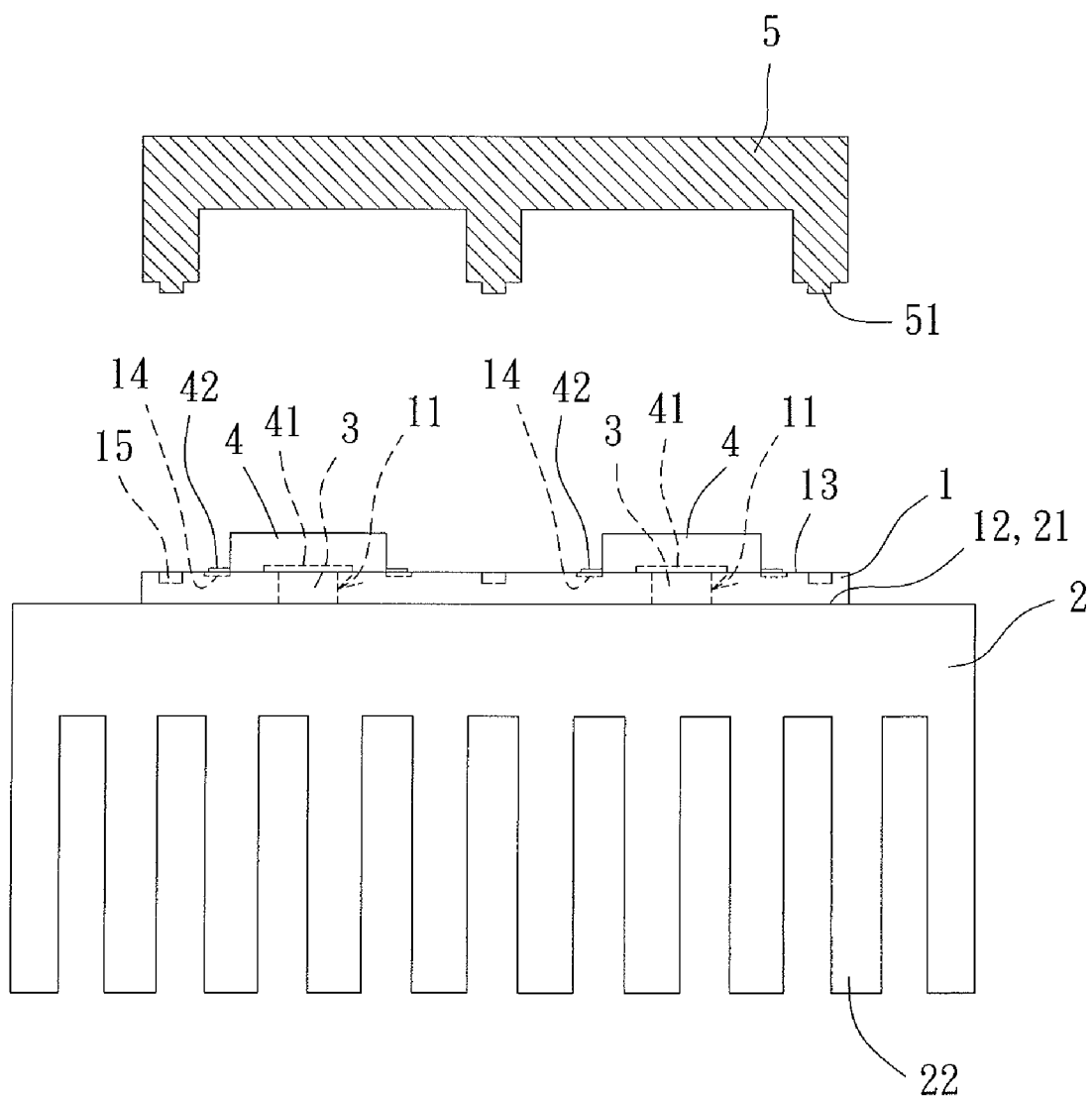
FIG. 8 shows the cooling module before a positioning step that is prior to the performance of a fifth step of the cooling module assembly method, according to the first embodiment of the invention.
Figure 9:
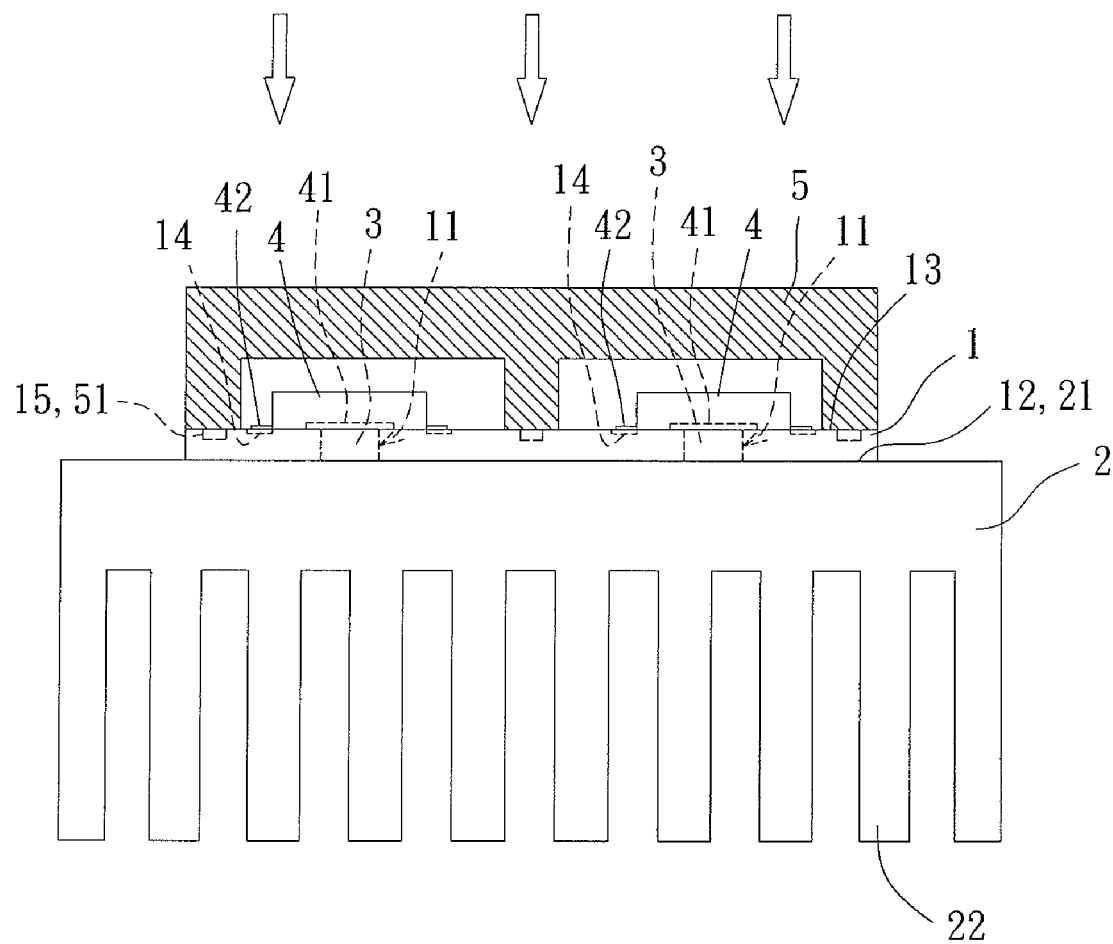
FIG. 9 shows the cooling module before the positioning step is performed, according to the first embodiment of the invention.
Figure 10:
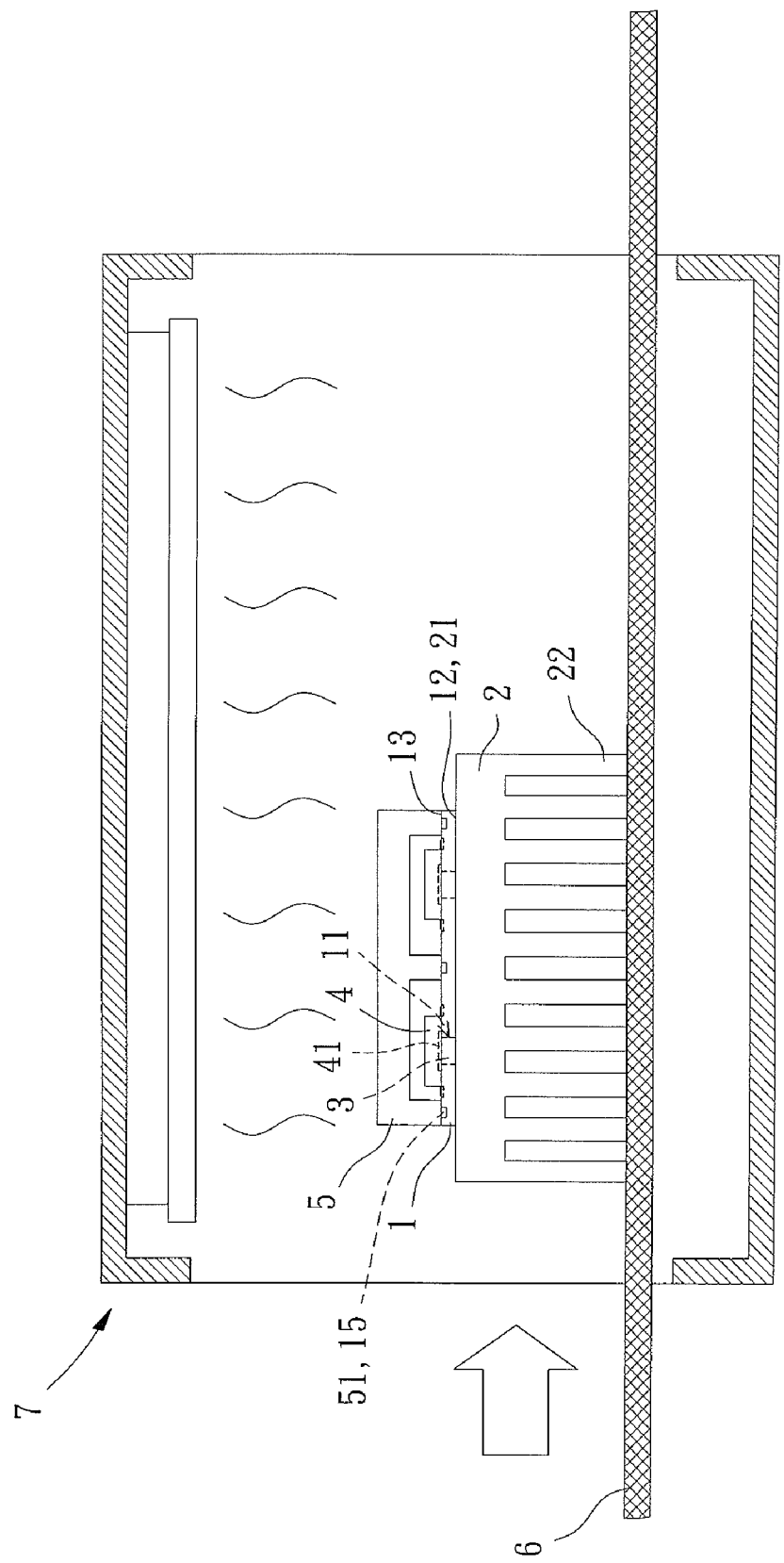
FIG. 10 shows a fifth step of the cooling module assembly method for assembling the cooling module according to the first embodiment of the invention.

Referring to FIGS. 8 to 10, a positioning step is performed prior to a fifth step S5 of the cooling module assembly method. The positioning step is to abut a plurality of first abutting portions 51 of a positioning fixture 5 with a plurality of second abutting portions 15 of the circuit board 1 so that the positioning fixture 5 may be accurately positioned on the second face 13 of the circuit board 1. Furthermore, the positioning fixture 5 applies an external force to the circuit board 1 so that the circuit board 1 may be closely coupled to the coupling face 21 of the heat dissipating unit 2. By far, the fifth step S5 of the cooling module assembly method is performed to melt the metal solders 3 in the at least one through-hole 11 and on the contacts 14 of the circuit board 1 via a Surface Mount Technology (SMT).

Specifically, after the coupling face 21 of the heat dissipating unit 2 is closely pressed by the circuit board 1 via the use of the positioning fixture 5, a transmission unit 6 such as a conveyer is used to send the circuit board 1, heat dissipating unit 2, metal solders 3, heat-generating element 4 and positioning fixture 5 all together into a reflow oven 7, to melt the metal solders 3. In this way, the metal solders 3 are melted on the coupling face 21 of the heat dissipating unit 2 and on the heat-conducting portion 41 of the heat-generating element 4, allowing the heat-generating element 4 to be closely soldered on the second face 13 of the circuit board 1. Also, the heat-generating element 4 is electrically connected to a circuit routing embedded in the circuit board 1. Based on this, the invention may allow the heat-generating element 4 to directly connect to the heat dissipating unit 2 via the metal solders 3 during a single round of SMT process. Besides, since the circuit board 1 is sandwiched between the heat dissipating unit 2 and the heat-generating element 4, the heat-generating element 4 may also be soldered on and electrically connected to the circuit board 1.

In the first embodiment, although the first abutting portions 51 of the positioning fixture 5 and the second abutting portions 15 of the circuit board 1 are implemented as flange-and-tongue structure, other structures are also possible.

The cooling module assembly method of the invention primarily allows the heat-generating element 4 to directly couple to the heat dissipating unit 2 using the metal solders 3 filled in the at least one through-hole 11 formed on the circuit board 1, which directs the heat generated by the heat-generating element 4 to the heat dissipating unit 2 via the metal solders 3. More particularly, since the heat-conducting portion 41, metal solders 3 and the heat dissipating unit 2 are of metal materials with high heat conductivity, the heat-conducting portion 41 may directly deliver the heat to the heat dissipating unit 2 via the metal solders 3 as the temperature of the heat-generating element 4 increases. Thus, cooling of the heat-generating element 4 is achieved, and the service life of the heat-generating element 4 is prolonged.

In addition, since the invention may improve the cooling efficiency of a cooling module, the heat spreader plate is no longer required to be arranged in the cooling module, thereby reducing cost of the cooling module.

Moreover, the assembly of the circuit board 1, heat dissipating unit 2 and the heat-generating element 4 may be accomplished in one round of SMT process, which allows the circuit board 1 to be assembled between the heat dissipating unit 2 and the heat-generating element 4 and to be electrically connected to the heat-generating element 4. Thus, multiple processes for separately assembling the circuit board 1 together with the heat dissipating unit 2, or the circuit board 1 together with the heat-generating element 4, are not required. In addition, since the invention may fix the heat dissipating unit 2 and the heat-generating element 4 on the first face 12 and the second face 13 of the circuit board 1 respectively, better assembly stability is ensured.

Figure 11:
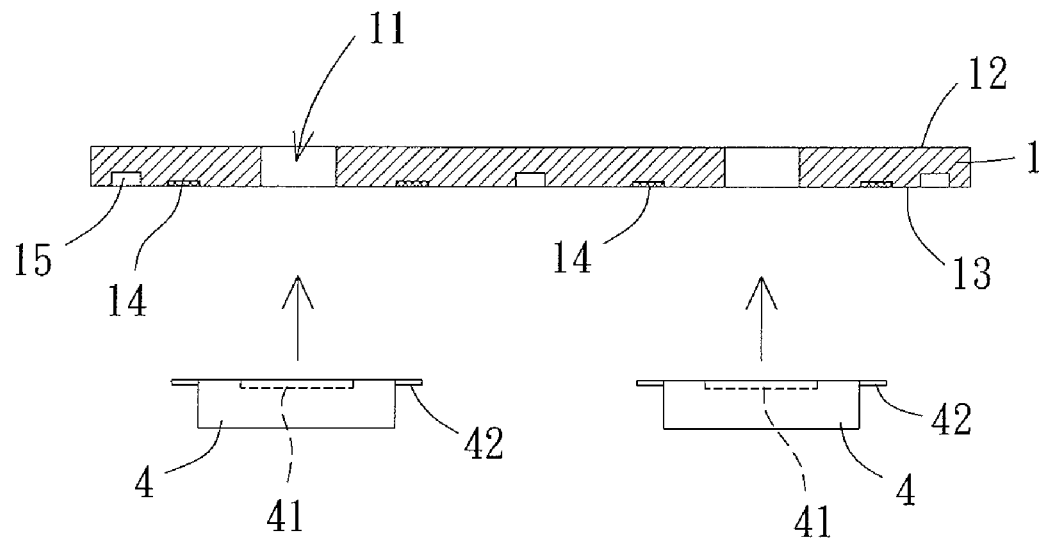
FIG. 11 shows a first step of a cooling module assembly method for assembling a cooling module according to a second embodiment of the invention.
Figure 12:
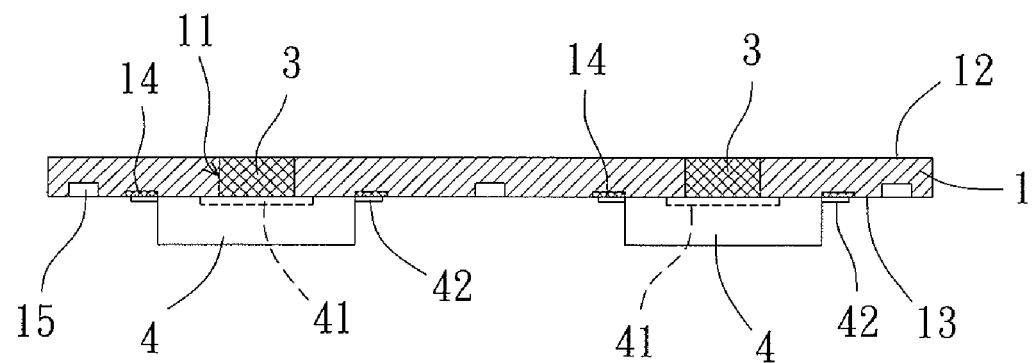
FIG. 12 shows a second step of the cooling module assembly method for assembling the cooling module according to the second embodiment of the invention.
Figure 13:
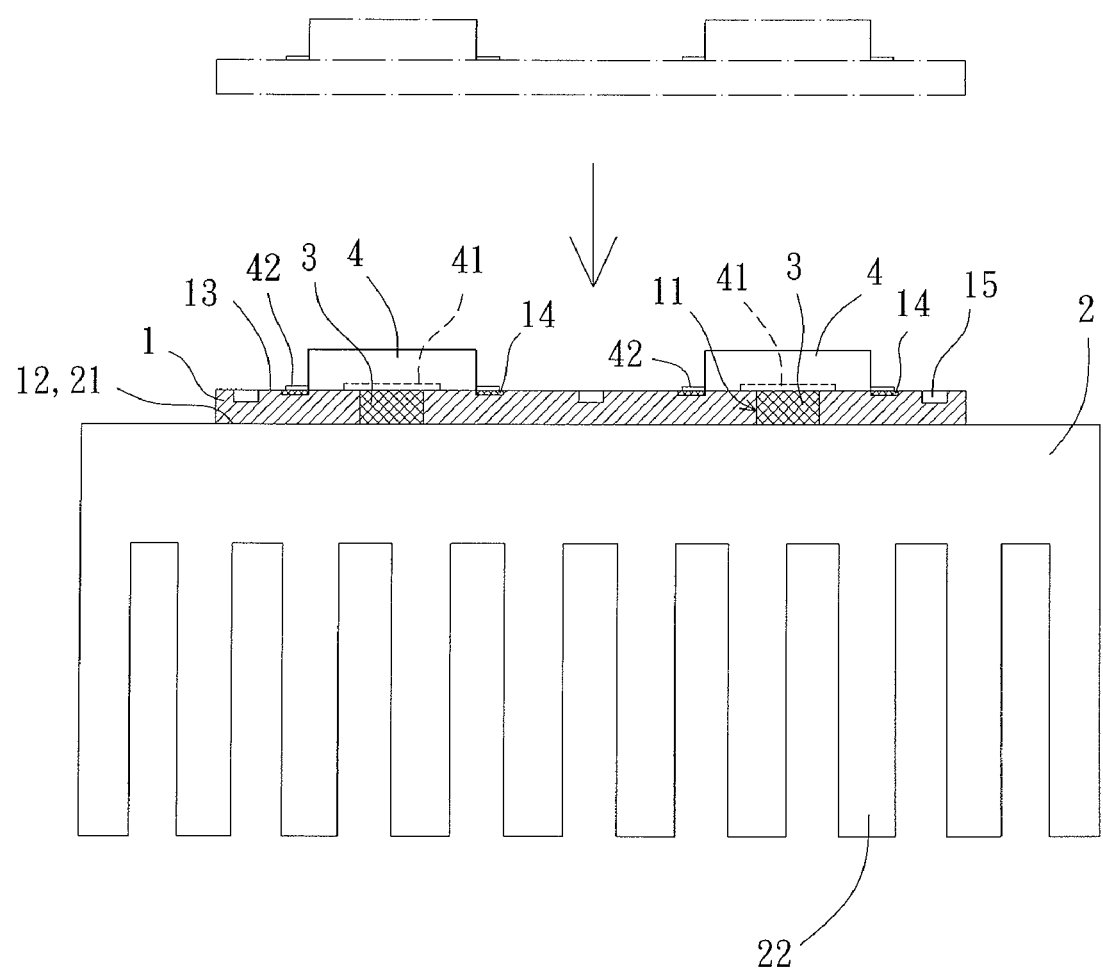
FIG. 13 shows a third step of the cooling module assembly method for assembling the cooling module according to the second embodiment of the invention.

Referring to FIGS. 11 and 13, a cooling module assembly method is shown according to a second embodiment of the invention. In comparison with the first embodiment, the cooling module assembly method in the second embodiment forms at least one through-hole 11 on the circuit board 1 (as the first step Si in the first embodiment). Then, the cooling module assembly method disposes the heat-generating element 4 on the second face 13 of the circuit board 1 (as the fourth step S4 in the first embodiment). The heat-conducting portion 41 of the heat-generating element 4 aligns with and covers an end of the at least one through-hole 11, and the pins 42 of the heat-generating element 4 are soldered on the contacts 14 of the circuit board 1 (as shown in FIG. 11). Following, the cooling module assembly method fills the at least one through-hole 11 with the metal solders 3 from another end of the at least one through-hole 11 not closed by the heat dissipating unit 2 (as the third step S3 in the first embodiment), as shown in FIG. 12. Next, the cooling module assembly method couples the coupling face 21 of the heat dissipating unit 2 to the first face 12 of the circuit board 1 (as the second step S2 in the first embodiment), thereby enclosing the metal solders 3 in the at least one through-hole 11 (as shown in FIG. 13). Finally, the cooling module assembly method uses the positioning fixture 5 to closely couple the circuit board 1 to the coupling face 21 of the heat dissipating unit 2 and sends the circuit board 1, heat dissipating unit 2, metal solders 3, heat-generating element 4 and positioning fixture 5 all together into the reflow oven 7 to melt the metal solders 3 (as the fifth step S5 in the first embodiment), as shown in FIGS. 8 to 10.

The order of the second step S2 to fourth step S4 may be adjusted according to the structure of the cooling modules. Therefore, the proposed cooling module assembly method may be widely used in assembling of various cooling modules.

Figure 14:
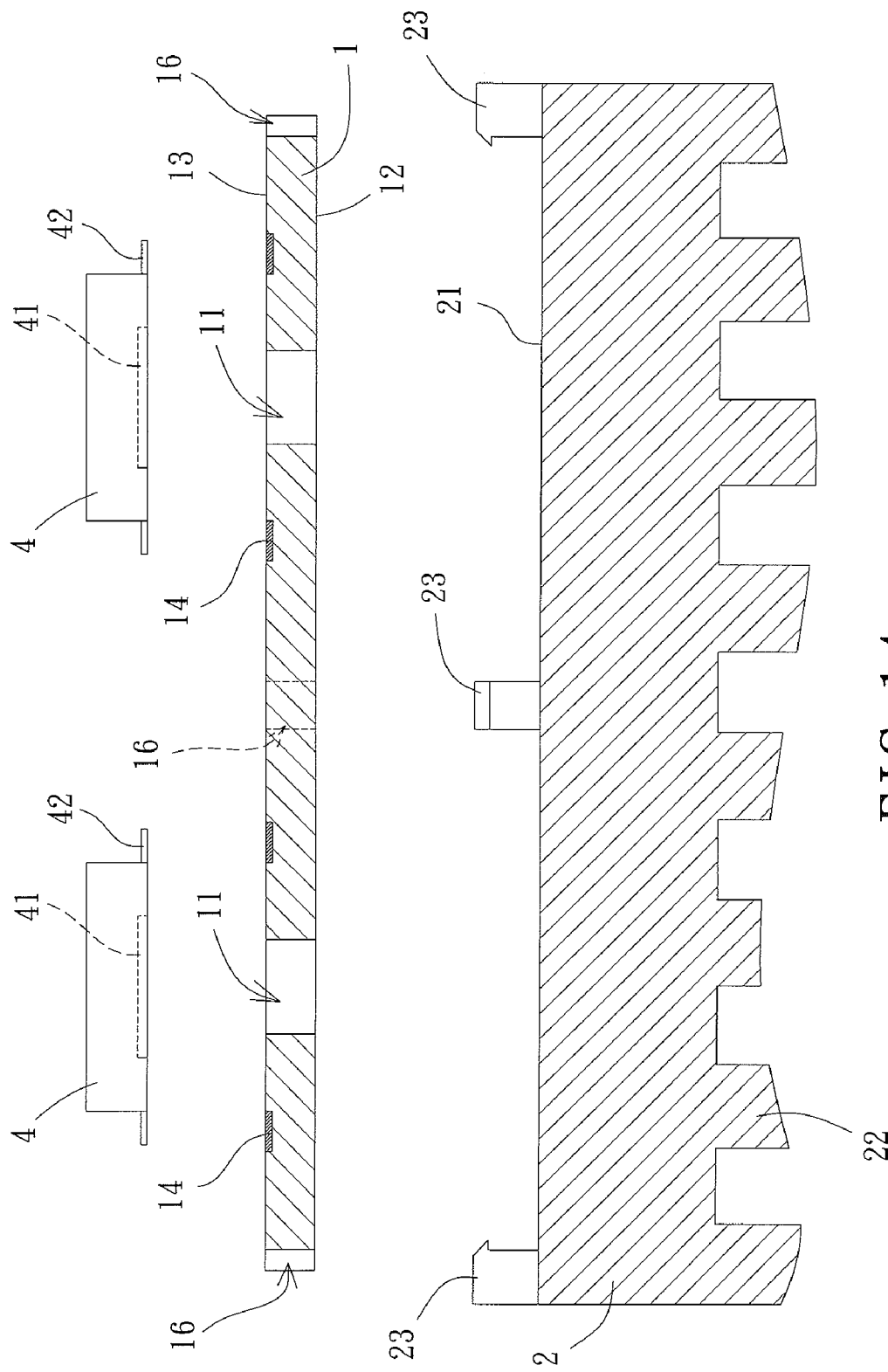
FIG. 14 shows a cooling module before being assembled by a cooling module assembly method according to a third embodiment of the invention.
Figure 15:
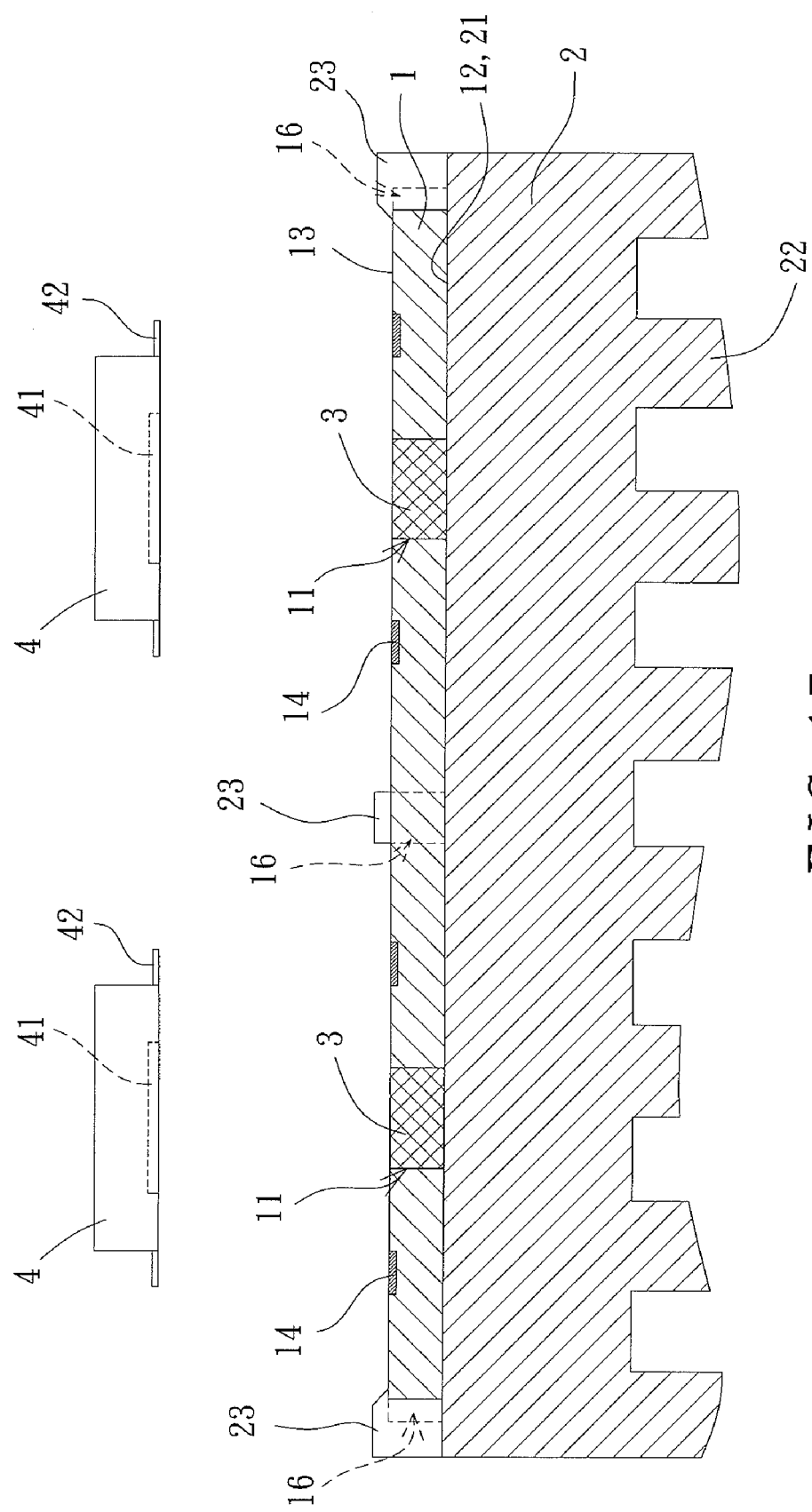
FIG. 15 shows the cooling module after a positioning step and filling of metal solders according to the third embodiment of the invention.
Figure 16:
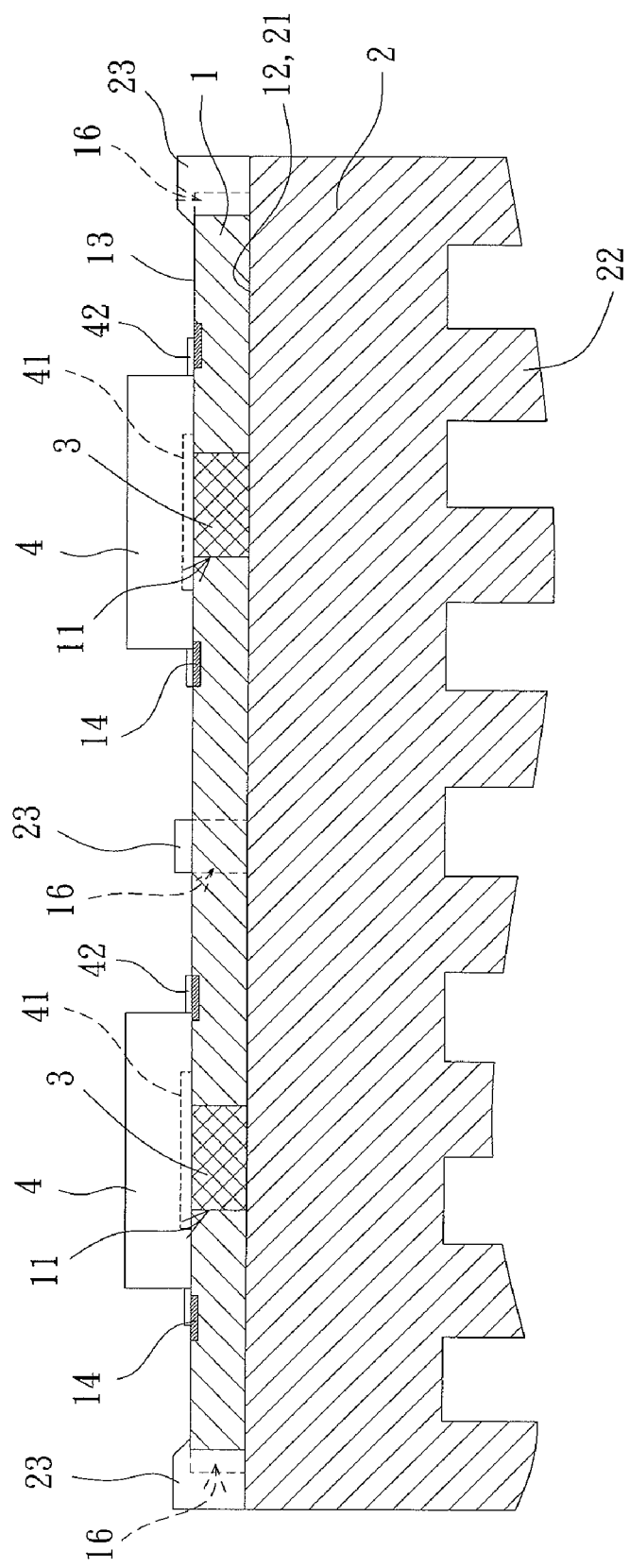
FIG. 16 shows the cooling module after assembly according to the third embodiment of the invention.

Referring to FIGS. 14 to 16, a cooling module assembly method is shown according to a third embodiment of the invention. In comparison with the first embodiment, the positioning step is performed in the second step S2 in the third embodiment. Particularly, when the first face 12 of the circuit board 1 is coupled to the coupling face 21 of the heat dissipating unit 2, the circuit board 1 may be coupled with the heat dissipating unit 2 without any shift by coupling a plurality of first positioning portions 16 of the circuit board 1 to a plurality of second positioning portions 23 of the heat dissipating unit 2. Based on this, subsequent steps, such as filling the metal solders 3, positioning the heat-generating element 4, performing the SMT process, and so on, may be performed in later stages.

The first positioning portions 16 and second positioning portions 23 are respectively implemented as buckling grooves and hooks, but not limited thereto.

Figure 17:
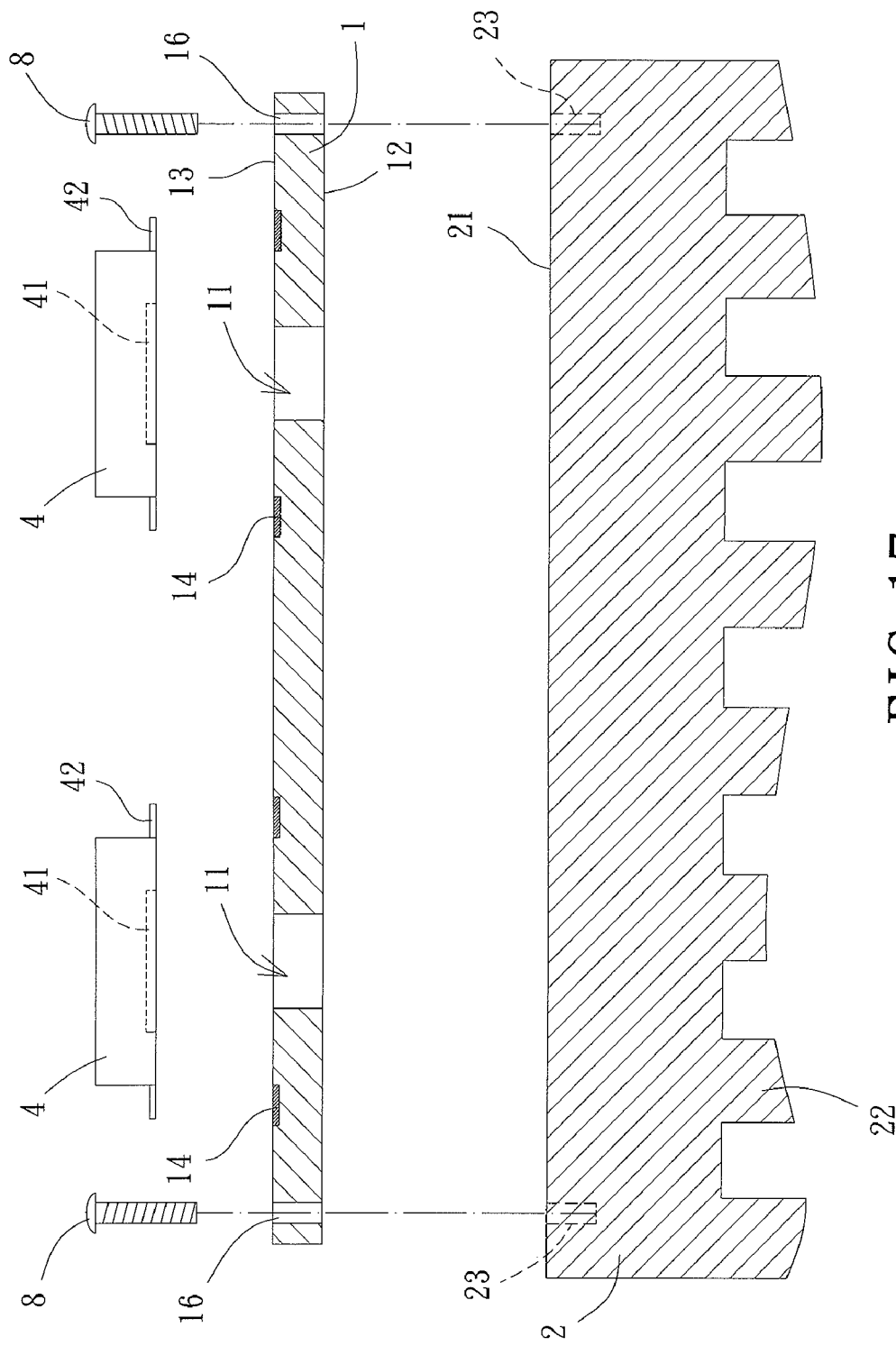
FIG. 17 shows a cooling module before assembly according to a fourth embodiment of the invention.
Figure 18:
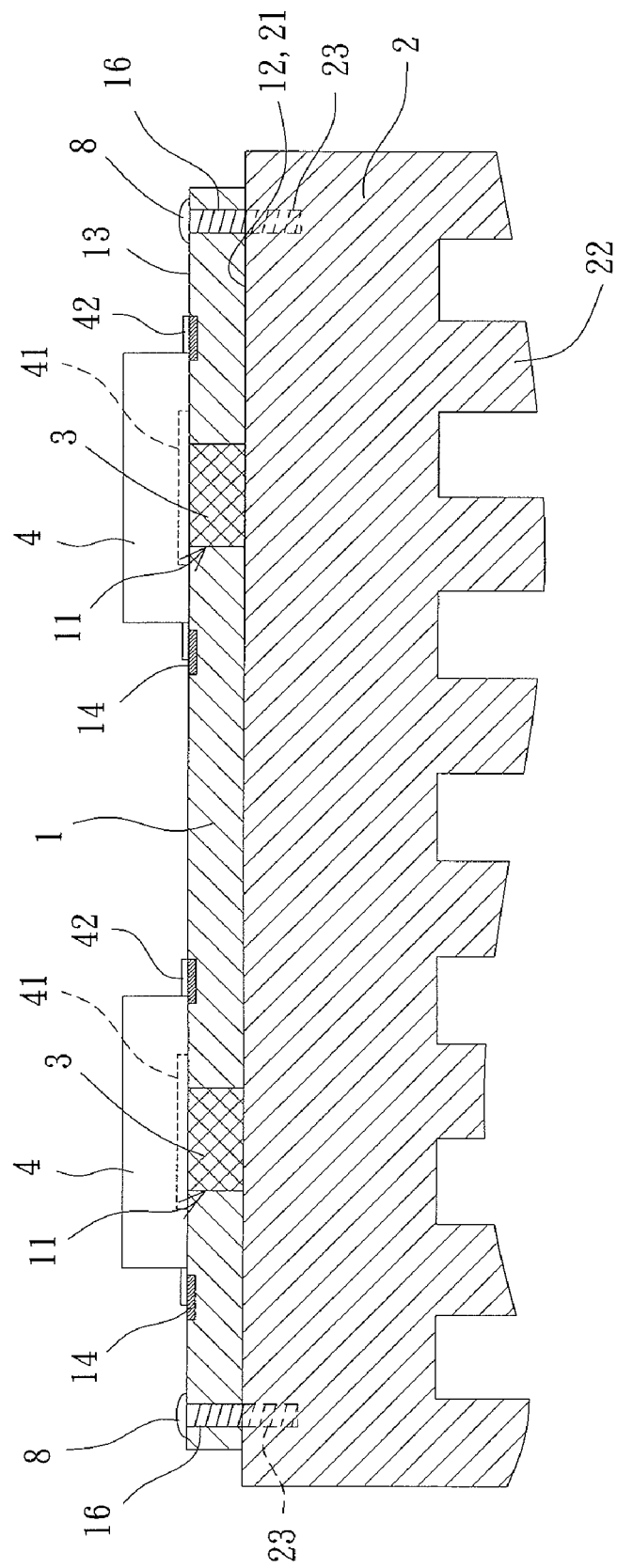
FIG. 18 shows a cooling module after assembly according to the fourth embodiment of the invention.

Referring to FIGS. 17 and 18, a cooling module assembly method is shown according to a fourth embodiment of the invention. In comparison with the third embodiment, the first positioning portions 16 and second positioning portions 23 are implemented as screw holes. The first positioning portions 16 are made aligned with the second positioning portions 23 when the first face 12 of the circuit board 1 is coupled to the coupling face 21 of the heat dissipating unit 2. In the same time, a screwing member 8 is used to screw each first positioning portion 16 and second positioning portion 23 together so that the circuit board 1 may be well coupled with the heat dissipating unit 2 without any shift.

Figure 19:
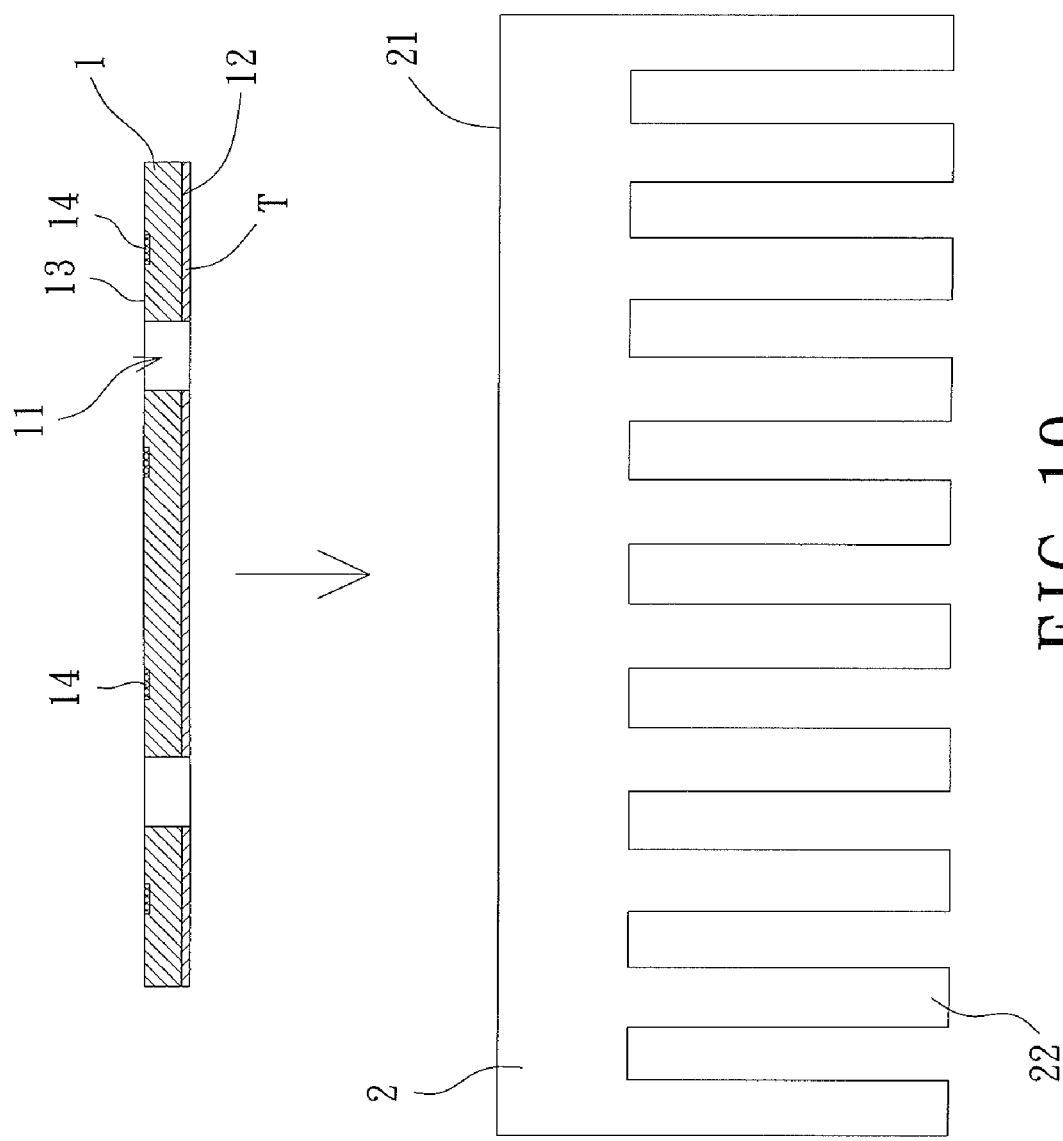
FIG. 19 shows a cooling module where a circuit board thereof is coated with a viscose according to a fifth embodiment of the invention.
Figure 20:
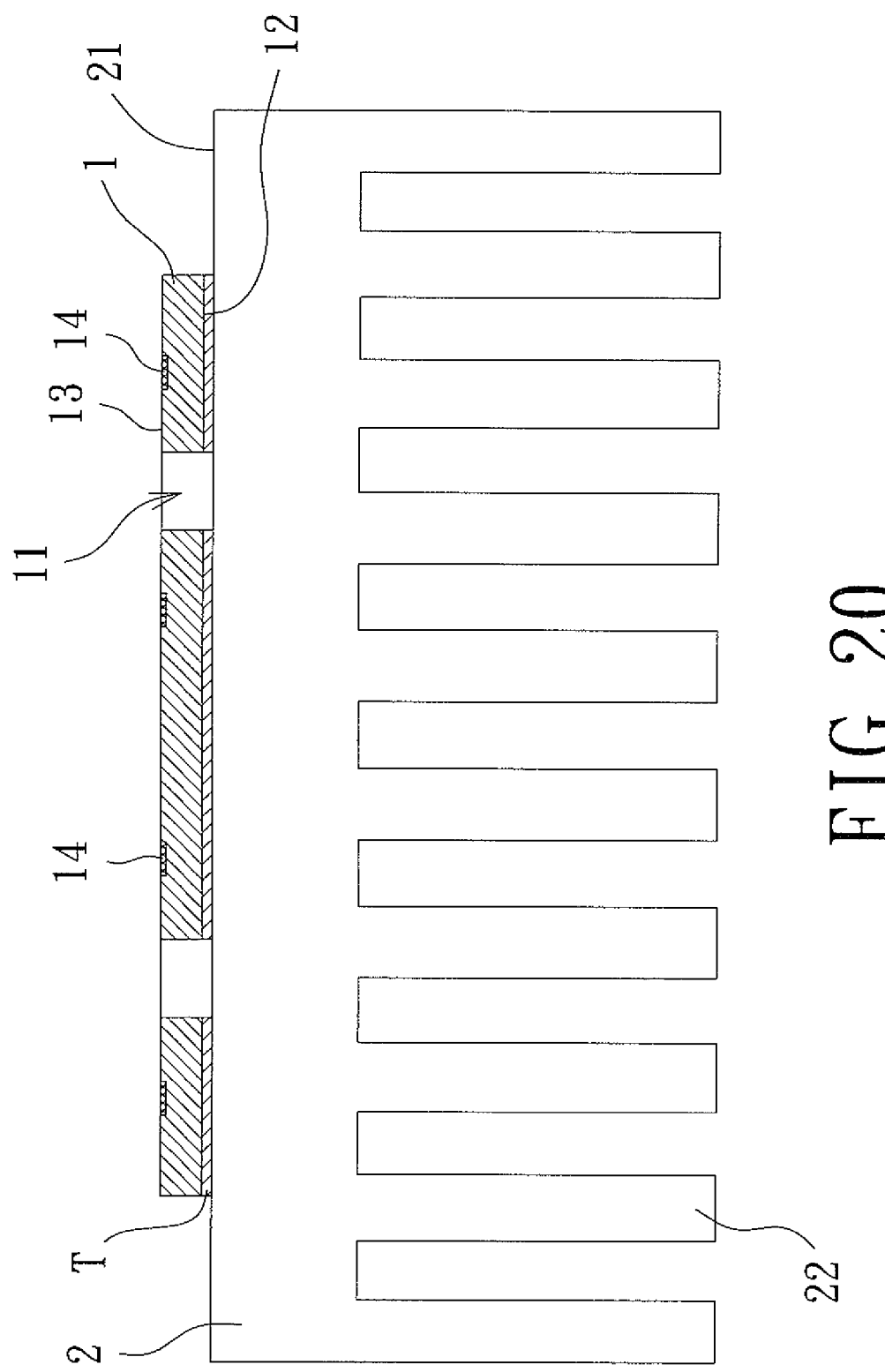
FIG. 20 shows the cooling module where the circuit board is coupled with a heat dissipating unit according to the fifth embodiment of the invention.
Figure 21:
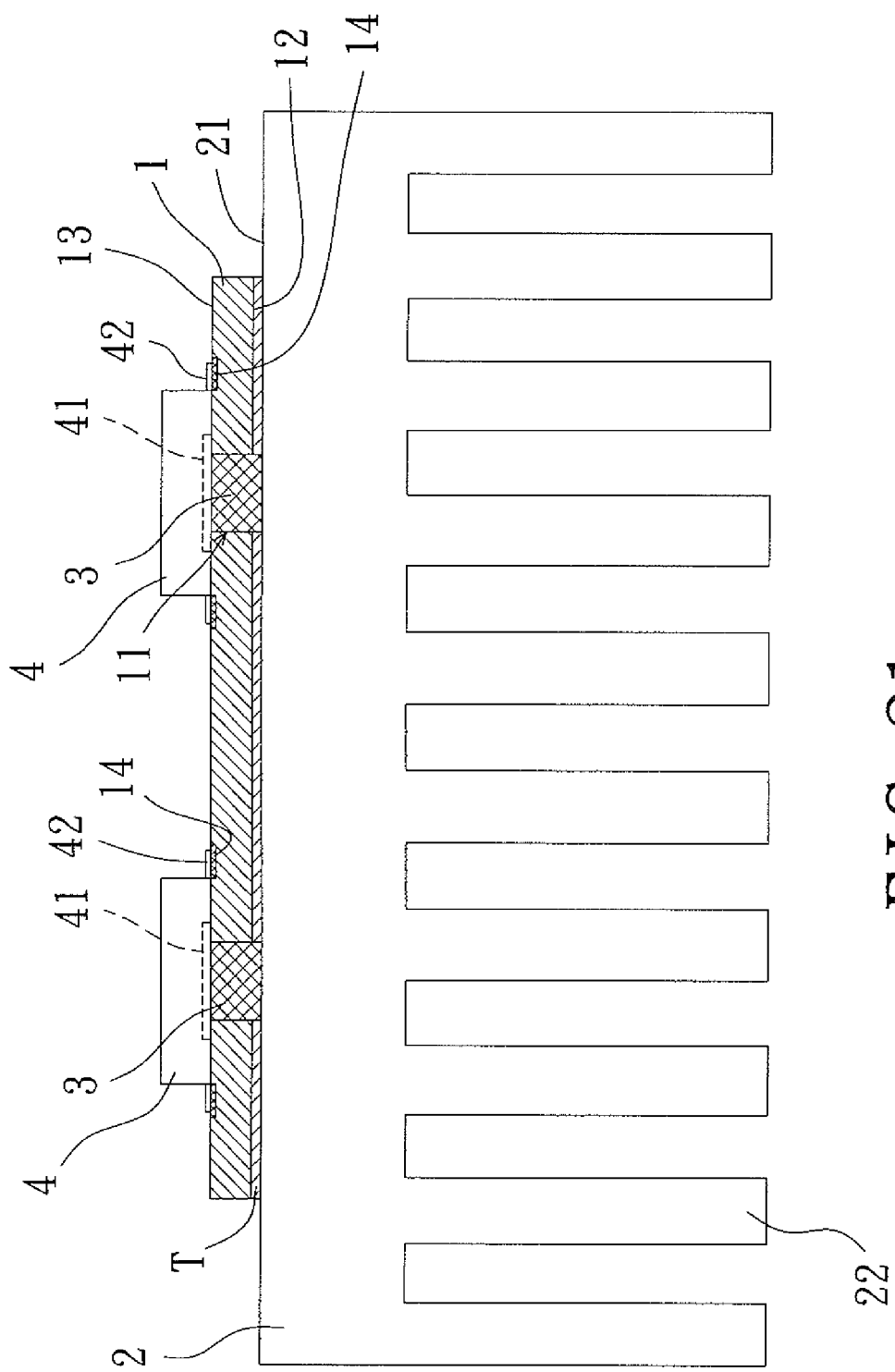
FIG. 21 shows the cooling module after assembly according to the fifth embodiment of the invention.

Referring to FIGS. 19 to 21, a cooling module assembly method is shown according to a fifth embodiment of the invention. In comparison with the first embodiment, the positioning step in the fifth embodiment is performed during the second step S2. Specifically, before the circuit board 1 and the heat dissipating unit 2 are coupled with each other, the first face 12 of the circuit board 1 or the coupling face 21 of the heat dissipating unit 2 is coated with a viscose. In the embodiment, the first face 12 of the circuit board 1 is coated with the viscose. Thus, when the first face 12 of the circuit board 1 is coupled to the coupling face 21 of the heat dissipating unit 2, the viscose may form an adhesive layer T between the circuit board 1 and the heat dissipating unit 2, allowing the circuit board 1 to be well coupled with the heat dissipating unit 2 without any shift. Based on this, subsequent steps, such as filling the metal solders 3, positioning the heat-generating element 4, performing the SMT process, and so on, may be performed in later stages.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A cooling module assembly method comprising:
   forming at least one through-hole on a circuit board;
   coupling the circuit board to a heat dissipating unit so that a face of the circuit board is coupled to a coupling face of the heat dissipating unit;
   filling the at least one through-hole with metal solders;
   fixing at least one heat-generating element to another face of the circuit board, wherein the at least one heat-generating element aligns with and covers the at least one through-hole; and
   melting the metal solders filled in the at least one through-hole while the circuit board is coupled to the heat dissipating unit and fixed to the at least one-heat generating element to directly connect the heat-generating element to the heat dissipating unit during a single round of melting, wherein coupling the heat dissipating unit comprises hooking a plurality of hooks of the heat dissipating unit with a plurality of buckling grooves of the circuit board.

2. The cooling module assembly method as claimed in claim 1, further comprising positioning a positioning fixture on the circuit board before melting the metal solders, wherein the positioning fixture applies an external force to the circuit board so that the circuit board is closely coupled to the coupling face of the heat dissipating unit.

3. The cooling module assembly method as claimed in claim 2, wherein the positioning fixture comprises a plurality of first abutting portions abutting with a plurality of second abutting portions of the circuit board.

4. The cooling module assembly method as claimed in claim 1, wherein the circuit board comprises a plurality of screw holes aligning with a plurality of screw holes of the heat dissipating unit, and wherein coupling the circuit board to the heat dissipating unit comprises extending a plurality of screwing members into the plurality of screw holes of the circuit board and the plurality of screw holes of the heat dissipating unit to couple the circuit board with the heat dissipating unit.

5. The cooling module assembly method as claimed in claim 1, further comprising coating the face of the circuit board or the coupling face of the heat dissipating unit with a viscose before the face of the circuit board is coupled to the coupling face of the heat dissipating unit.

6. The cooling module assembly method as claimed in claim 1, wherein the at least one heat-generating element comprises a heat-conducting portion for aligning with and covering one end of the at least one through-hole.

7. The cooling module assembly method as claimed in claim 6, wherein melting the metal solders comprises sending the circuit board, the heat dissipating unit, the metal solders and the at least one heat-generating element into a reflow oven to melt the metal solders.

8. The cooling module assembly method as claimed in claim 1, wherein the at least one through-hole is filled with the metal solders through one end of the at least one through-hole not closed by the heat dissipating unit.

9. The cooling module assembly method as claimed in claim 1, wherein the at least one through-hole is formed by punching.

10. The cooling module assembly method as claimed in claim 1, wherein the metal solders are solder paste.

11. A cooling module assembly method comprising:
    forming at least one through-hole on a circuit board;
    fixing at least one heat-generating element to a face of the circuit board, wherein the at least one heat-generating element aligns with and covers one end of the at least one through-hole;
    filling the at least one through-hole with metal solders;
    coupling a heat dissipating unit to another face of the circuit board, wherein the heat dissipating unit comprises a coupling face aligning with and covering another end of the at least one through-hole; and
    melting the metal solders filled in the at least one through-hole while the circuit board is coupled to the heat dissipating unit and fixed to the at least one-heat generating element to directly connect the heat-generating element to the heat dissipating unit during a single round of melting, wherein coupling the heat dissipating unit comprises hooking a plurality of hooks of the heat dissipating unit with a plurality of buckling grooves of the circuit board.

12. The cooling module assembly method as claimed in claim 11, further comprising positioning a positioning fixture on the circuit board before melting the metal solders, wherein the positioning fixture applies an external force to the circuit board so that the circuit board is closely coupled to the coupling face of the heat dissipating unit.

13. The cooling module assembly method as claimed in claim 12, wherein the positioning fixture comprises a plurality of first abutting portions abutting with a plurality of second abutting portions of the circuit board.

14. The cooling module assembly method as claimed in claim 11, wherein the circuit board comprises a plurality of screw holes aligning with a plurality of screw holes of the heat dissipating unit, and wherein coupling the circuit board to the heat dissipating unit comprises extending a plurality of screwing members into the plurality of screw holes of the circuit board and the plurality of screw holes of the heat dissipating unit to couple the circuit board with the heat dissipating unit.

15. The cooling module assembly method as claimed in claim 11, further comprising coating the face of the circuit board or the coupling face of the heat dissipating unit with a viscose before coupling the heat dissipating unit to the circuit board.

16. The cooling module assembly method as claimed in claim 11, wherein the at least one heat-generating element comprises a heat-conducting portion for aligning with and covering the one end of the at least one through-hole.

17. The cooling module assembly method as claimed in claim 16, wherein melting the metal solders comprises sending the circuit board, the heat dissipating unit, the metal solders and the at least one heat-generating element into a reflow oven to melt the metal solders.

18. The cooling module assembly method as claimed in claim 11, wherein the at least one through-hole is filled with the metal solders through another end of the at least one through-hole not closed by the at least one heat-generating element.

19. The cooling module assembly method as claimed in claim 11, wherein the at least one through-hole is formed by punching.

20. The cooling module assembly method as claimed in claim 11, wherein the metal solders are solder paste.

* * * * *